United States Patent
Chen

(10) Patent No.: US 10,276,592 B2
(45) Date of Patent: Apr. 30, 2019

(54) DISPLAY SUBSTRATE, METHOD OF FABRICATING THE SAME, DISPLAY PANEL AND PRESSURE WELDING DEVICE

(71) Applicant: BOE TECHNOLOGY GROUP CO., LTD., Beijing (CN)

(72) Inventor: Liqiang Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/744,959

(22) PCT Filed: Jul. 4, 2017

(86) PCT No.: PCT/CN2017/091630
§ 371 (c)(1),
(2) Date: Jan. 15, 2018

(87) PCT Pub. No.: WO2018/113247
PCT Pub. Date: Jun. 28, 2018

(65) Prior Publication Data
US 2019/0013335 A1    Jan. 10, 2019

(30) Foreign Application Priority Data

Dec. 19, 2016 (CN) .......................... 2016 1 1180414

(51) Int. Cl.
| | |
|---|---|
| *H01L 27/12* | (2006.01) |
| *H01L 51/56* | (2006.01) |
| *H01L 51/00* | (2006.01) |

(52) U.S. Cl.
CPC ...... *H01L 27/1218* (2013.01); *H01L 27/1262* (2013.01); *H01L 27/1288* (2013.01);
(Continued)

(58) Field of Classification Search
None
See application file for complete search history.

(56) References Cited

U.S. PATENT DOCUMENTS

2003/0087476 A1*  5/2003  Oohata .................... G09F 9/33
                                                438/108

FOREIGN PATENT DOCUMENTS

| CN | 103296056 A | 9/2013 |
|---|---|---|
| CN | 105977400 A | 9/2016 |

(Continued)

OTHER PUBLICATIONS

International Search Report dated Oct. 12, 2017 corresponding to application No. PCT/CN2017/091630.

*Primary Examiner* — Michelle Mandala
(74) *Attorney, Agent, or Firm* — Nath, Goldberg & Meyer; Joshua B. Goldberg; Tanya E. Harkins

(57) ABSTRACT

The present disclosure provides a display substrate and a method of fabricating the same, a display panel and a pressure welding device. The display substrate includes a flexible substrate having a first surface and a second surface opposite to each other, and the first surface includes a first area and a second area. The method includes forming thin film transistors and light-emitting elements in the first area, forming a lead for circuit-bonding in the second area, forming a curable material layer on the second surface, and performing a curing process on a part of the curable material layer corresponding to the second area to form a cured layer. The technical solutions of the present disclosure improves the stability of pressure welding during a pressure welding process of circuit component, and lowers the possibility of occurrence of wire defect.

18 Claims, 3 Drawing Sheets

(52) U.S. Cl.
 CPC ...... *H01L 51/0024* (2013.01); *H01L 51/0097* (2013.01); *H01L 51/56* (2013.01)

(56) References Cited

FOREIGN PATENT DOCUMENTS

CN 106783878 A 5/2017
WO WO 2011126726 A1 * 10/2011 ......... H01L 21/6835

* cited by examiner

DISPLAY SUBSTRATE, METHOD OF FABRICATING THE SAME, DISPLAY PANEL AND PRESSURE WELDING DEVICE

CROSS-REFERENCE TO RELATED APPLICATIONS

This is a National Phase Application filed under 35 U.S.C. 371 as a national stage of PCT/CN2017/091630, filed on Jul. 4, 2017, an application claiming the benefit of Chinese Patent Application No. 201611180414.2, filed on Dec. 19, 2016, the contents of which are incorporated by reference in the entirety.

TECHNICAL FIELD

The present disclosure relates to the field of display technologies, and particularly, to a display substrate and a method of fabricating the same, a display panel and a pressure welding device.

BACKGROUND

Currently, the process of fabricating flexible display substrates has developed greatly. Typically, in a process of fabricating a flexible display substrate, a flexible substrate is first fixed on a glass substrate, and then a process of fabricating a backplane is performed. These processes are compatible with existing processes of fabricating liquid crystal display apparatuses. After the fabrication of the flexible substrate is completed, the flexible substrate and the glass substrate are separated from each other, and then the flexible substrate is made flat by attaching a back film on the rear side of the flexible substrate. After that, processes, such as a bonding process, a cutting process and the like, are performed.

SUMMARY

In an aspect, the present disclosure provides a method of fabricating a display substrate. The display substrate includes a flexible substrate having a first surface and a second surface opposite to each other, and the first surface includes a first area and a second area. The method includes forming thin film transistors and light-emitting elements in the first area, forming a lead for circuit-bonding in the second area, forming a curable material layer on the second surface, and performing a curing process on a part of the curable material layer corresponding to the second area to form a cured layer.

Optionally, the curable material layer includes an ultraviolet-curable material, and the step of performing the curing process on the part of the curable material layer corresponding to the second area includes performing an ultraviolet-curing process on the part of the curable material layer corresponding to the second area.

Optionally, the curable material layer includes a heat-curable material, and the step of performing the curing process on the part of the curable material layer corresponding to the second area includes performing a heat-curing process on the part of the curable material layer corresponding to the second area.

Optionally, the method further includes performing a bonding process on a circuit component in the second area.

Optionally, the display substrate further includes a back-film base, and the step of forming the curable material layer on the second surface includes forming the curable material layer between the flexible substrate and the back-film base.

Optionally, the curable material layer is a back-film adhesive layer, and the step of forming the curable material layer on the second surface includes attaching the back-film base having the back-film adhesive layer to the flexible substrate.

In another aspect, the present disclosure provides a display substrate. The display substrate includes a flexible substrate having a first surface and a second surface opposite to each other, and the first surface includes a first area and a second area. The first area is provided with thin film transistors and light-emitting elements, and the second area is provided with a lead for circuit-bonding. The second surface is provided with a curable material layer and a cured layer, and the cured layer is provided in correspondence with the second area. The cured layer is configured to be formed by performing a curing process on the curable material layer.

Optionally, the second area includes an integrated-circuit-chip area and a flexible-circuit-board area, and the integrated-circuit-chip area and the flexible-circuit-board area are included in a projection area of the cured layer on the flexible substrate.

Optionally, the display substrate further includes a back-film base, and the curable material layer and the cured layer are provided between the flexible substrate and the back-film base.

Optionally, the curable material layer is a back-film adhesive layer, and the back-film adhesive layer includes an optical adhesive layer.

In another aspect, the present disclosure provides a display panel, which includes any one of the display substrates described herein or fabricated by any one of the methods described herein.

In another aspect, the present disclosure provides a pressure welding device for perform a pressure welding process on a display substrate. The display substrate includes a flexible substrate having a first surface and a second surface opposite to each other, and the first surface includes a first area and a second area. The first area is provided with thin film transistors and light-emitting elements, and the second area is provided with a lead for circuit-bonding. The second surface is provided with a curable material layer. The pressure welding device includes a curing unit and a pressure welding unit, the curing unit is configured to perform a curing process on a part of the curable material layer corresponding to the second area to form a cured layer, and the pressure welding unit is configured to perform a bonding process on a circuit component in the second area.

Optionally, the curing unit includes a first hot-pressing header provided above the display substrate, and the first hot-pressing header is configured to heat the part of the curable material layer corresponding to the second area.

Optionally, the curing unit includes a second hot-pressing header provided beneath the display substrate, and the second hot-pressing header is configured to heat the part of the curable material layer corresponding to the second area.

Optionally, the curing unit includes a first hot-pressing header provided above the display substrate and a second hot-pressing header provided beneath the display substrate, and the first hot-pressing header and the second hot-pressing header are configured to heat the part of the curable material layer corresponding to the second area.

Optionally, the circuit component includes an integrated circuit chip and/or a flexible circuit board.

DETAILED DESCRIPTION

To make those skilled in the art better understand the technical solutions of the present disclosure, a display substrate and a method of fabricating the same, a display panel and a pressure welding device provided by the present disclosure will be described below in detail in conjunction with the accompanying drawings.

Currently, the process of fabricating flexible display substrates has developed greatly. Typically, in a process of fabricating a flexible display substrate, a flexible substrate is first fixed on a glass substrate, and then a process of fabricating a backplane is performed. These processes are compatible with existing processes of fabricating liquid crystal display apparatuses. After the fabrication of the flexible substrate is completed, the flexible substrate and the glass substrate are separated from each other, and then the flexible substrate is made flat by attaching a back film on the rear side of the flexible substrate. After that, processes, such as a bonding process, a cutting process and the like, are performed. An integrated circuit chip to be attached to the flexible substrate has a high hardness, while the flexible substrate and the back film have a low hardness, in particular, a layer of an adhesive material, which is configured to be attached on the flexible substrate, on the back film has a thickness in a range from approximately 10 μm to approximately 30 μm and has a low hardness. Thus, during a pressure welding process of the integrated circuit chip, a flow of the adhesive material may occur, such that the flexible substrate may be deformed, which in turn easily leads to a wire breakage.

To alleviate or at least partially alleviate the above problems, the present disclosure provides a display substrate and a method of fabricating the same, a display panel and a pressure welding device, which can improve stability of pressure welding in pressure welding process of circuit components and lower possibility of occurrence of wire defect.

Figure 1:
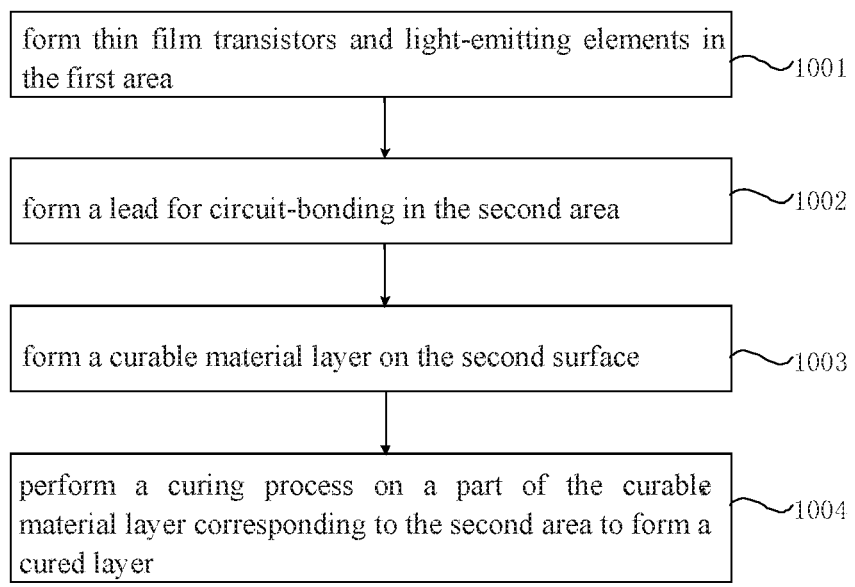
FIG. 1 is a flowchart illustrating a method of fabricating a display substrate according to an embodiment of the present disclosure.

In an aspect, the present disclosure provides a method of fabricating a display substrate. FIG. 1 is a flowchart illustrating a method of fabricating a display substrate according to an embodiment of the present disclosure. The display substrate includes a flexible substrate having a first surface and a second surface opposite to each other, and the first surface includes a first area and a second area. Optionally, the flexible substrate includes polyimide.

As shown in FIG. 1, the method includes steps 1001 to 1004.

At step 1001, thin film transistors and light-emitting elements are formed in the first area.

At step 1002, a lead for circuit-bonding is formed in the second area.

At step 1003, a curable material layer is formed on the second surface.

At step 1004, a curing process is performed on a part of the curable material layer corresponding to the second area to form a cured layer.

It should be noted that the curable material in the present embodiment refers to a material in which a curing reaction could be induced by means of ultraviolet-irradiation (UV-irradiation) or heat or the like, such that the material appears a solid state.

In the present embodiment, the curable material layer includes an UV-curable material, and the step of performing the curing process on the part of the curable material layer corresponding to the second area includes performing an UV-curing process on the part of the curable material layer corresponding to the second area. In the present embodiment, an UV-curing process is performed on the part of the curable material layer corresponding to the second area through an UV-curing mask. Specifically, a light transmission area of the UV-curing mask corresponds to the part of the curable material layer corresponding to the second area, and a light shielding area of the UV-curing mask corresponds to remaining parts of the curable material layer. The UV-curing mask is irradiated with UV rays, such that a part of the curable material layer corresponding to the light transmission area is cured, thereby increasing a hardness of an area corresponding to the second area. As such, in a subsequent pressure welding process (for bonding a circuit component) for the flexible display substrate, the second area has an improved stability due to the existence of the cured layer with higher hardness, thereby lowering the possibility of occurrence of wire defect.

In the present embodiment, optionally, the curable material layer includes a heat-curable material, and the step of performing the curing process on the part of the curable material layer corresponding to the second area includes performing a heat-curing process on the part of the curable material layer corresponding to the second area. In the present embodiment, a heat-curing process is performed on the part of the curable material layer corresponding to the second area by at least one hot-pressing header. The at least one hot-pressing header is provided in correspondence with the part of the curable material layer corresponding to the second area. Optionally, the at least one hot-pressing header may be provided above the curable material layer. Optionally, the at least one hot-pressing header may be provided beneath the curable material layer. Optionally, one of the at least one hot-pressing header is provided above the curable material layer and another one of the at least one hot-pressing header is provided beneath the curable material layer. In the present embodiment, the part of the curable material layer corresponding to the second area is heated by the at least one hot-pressing header and thus cured, such that an area corresponding to the second area has an increased hardness. As such, in a subsequent pressure welding process (for bonding a circuit component) for the flexible display substrate, the second area has an improved stability due to the existence of the cured layer with higher hardness, thereby lowering the possibility of occurrence of wire defect.

In the present embodiment, the method of fabricating the display substrate further includes performing a bonding process on a circuit component in the second area. The circuit component includes an integrated circuit chip and/or a flexible circuit board. Optionally, the display substrate further includes a back-film base. Optionally, the method of fabricating the display substrate further includes forming the curable material layer between the flexible substrate and the back-film base. Optionally, the curable material layer is a back-film adhesive layer such as an OCA (optical clear adhesive) layer. In an example, the curable material layer may be an UV-curable optical adhesive layer. In another example, the curable material layer may be a heat-curable optical adhesive layer. In the present embodiment, the back-film adhesive layer is formed between the flexible substrate and the back-film base and is directly being partially cured, such that a flow of the adhesive material may not occur during a pressure welding process on the flexible display substrate, thereby avoiding deformation of the flexible display substrate and lowering possibility of occurrence of wire defect.

Optionally, in the present embodiment, a pressure welding process of an integrated circuit chip is performed in the second area to bond the integrated circuit chip. Optionally, in the present embodiment, a pressure welding process of a flexible circuit board is performed in the second area to bond the flexible circuit board. Optionally, in the present embodiment, a pressure welding process of an integrated circuit chip and a flexible circuit board is performed in the second area to bond the integrated circuit chip and the flexible circuit board.

In the method of fabricating the display substrate according to the present embodiment, the display substrate includes a flexible substrate having a first surface and a second surface opposite to each other, and the first surface includes a first area and a second area. The method of fabricating the display substrate includes forming thin film transistors and light-emitting elements in the first area, forming a lead for circuit-bonding in the second area, and forming a curable material layer on the second surface. The curable material layer may be a back-film adhesive layer, and the step of forming the curable material layer on the second surface includes attaching a back-film base having the back-film adhesive layer to the flexible substrate. As such, after the back-film base being attached to the flexible substrate, it is convenient to perform a curing process on a particular area of the back-film adhesive layer of the back-film base. The method of fabricating the display substrate further includes performing a curing process on a part of the curable material layer corresponding to the second area to form a cured layer. In the technical solutions provided by the present embodiment, a partial curing process is performed on the part of the curable material layer corresponding to the second area, such that an area corresponding to the second area has an increased hardness. As such, in a subsequent pressure welding process (for bonding a circuit component) for the flexible display substrate, the second area has an improved stability due to the existence of the cured layer with higher hardness, thereby lowering the possibility of occurrence of wire defect.

Figure 2:
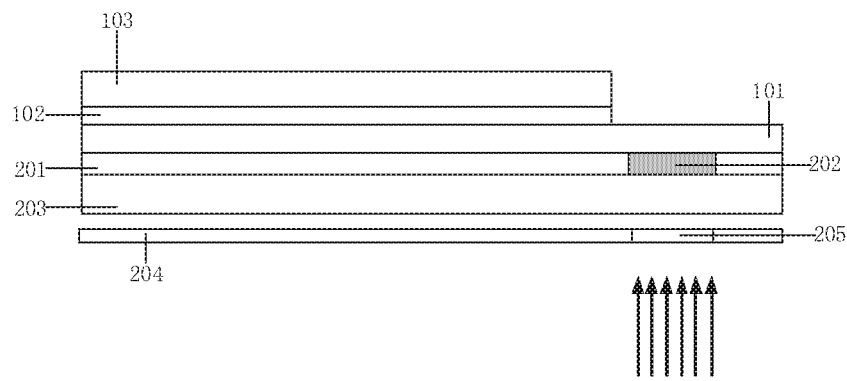
FIG. 2 is a schematic diagram illustrating a structure of a display substrate according to an embodiment of the present disclosure.

In another aspect, the present disclosure provides a display substrate. FIG. 2 is a schematic diagram illustrating a structure of a display substrate according to an embodiment of the present disclosure. As shown in FIG. 2, the display substrate includes a flexible substrate 101 having a first surface and a second surface opposite to each other, and the first surface includes a first area and a second area. The first area is provided with a light-emitting element layer 102. The light-emitting element layer 102 includes thin film transistors and light-emitting elements. The second area is provided with a lead for circuit-bonding. The second surface is provided with a curable material layer 201 and a cured layer 202, and the cured layer 202 is provided in correspondence with the second area. The cured layer 202 is configured to be formed by performing a curing process on the curable material layer 201. In the present embodiment, the cured layer is provided at a position of the curable material layer corresponding to the second area, such that an area corresponding to the second area has an increased hardness. As such, in a subsequent pressure welding process (for bonding a circuit component) for the flexible display substrate, the second area has an improved stability due to the existence of the cured layer with higher hardness, thereby lowering the possibility of occurrence of wire defect.

In the present embodiment, the curable material layer 201 and the cured layer 202 are provided between the flexible substrate 101 and a back-film base 203, and an encapsulation 103 is provided on the light-emitting element layer 102. Optionally, the curable material layer 201 is a back-film adhesive layer such as an OCA layer. In an example, the curable material layer 201 may be an UV-curable optical adhesive layer. In another example, the curable material layer 201 may be a heat-curable optical adhesive layer. Since the back-film adhesive layer is directly being partially cured to form the cured layer, a flow of the adhesive material may not occur during a pressure welding process on the flexible display substrate, thereby avoiding deformation of the flexible display substrate and lowering possibility of occurrence of wire defect.

In the present embodiment, optionally, the curable material layer 201 includes an UV-curable material, and an UV-curing process is performed on a part of the curable material layer 201 corresponding to the second area to form the cured layer 202. In the present embodiment, an UV-curing process is performed on the part of the curable material layer 201 corresponding to the second area through an UV-curing mask 204. Specifically, a light transmission area 205 of the UV-curing mask 204 corresponds to the part of the curable material layer 201 corresponding to the second area, and a light shielding area of the UV-curing mask 204 corresponds to remaining parts of the curable material layer 201. The UV-curing mask 204 is irradiated with UV rays, such that a part of the curable material layer 201 corresponding to the light transmission area is cured, thereby increasing a hardness of an area corresponding to the second area. As such, in a subsequent pressure welding process (for bonding a circuit component) for the flexible display substrate, the second area has an improved stability due to the existence of the cured layer with higher hardness, thereby lowering the possibility of occurrence of wire defect.

In the present embodiment, optionally, the curable material layer 201 includes a heat-curable material, and a heat-curing process is performed on the part of the curable material layer 201 corresponding to the second area to form the cured layer 202. In the present embodiment, at least one hot-pressing header is configured to perform a heat-curing process on the part of the curable material layer 201 corresponding to the second area. The at least one hot-pressing header is provided in correspondence with the part of the curable material layer 201 corresponding to the second area.

Optionally, the at least one hot-pressing header may be provided above the curable material layer 201. Optionally, the at least one hot-pressing header may be provided beneath the curable material layer 201. Optionally, one of the at least one hot-pressing header may be provided above the curable material layer 201 and another one of the at least one hot-pressing header may be provided beneath the curable material layer 201. In the present embodiment, the part of the curable material layer 201 corresponding to the second area is heated by the at least one hot-pressing header and thus cured, such that an area corresponding to the second area has an increased hardness. As such, in a subsequent pressure welding process (for bonding a circuit component) for the flexible display substrate, the second area has an improved stability due to the existence of the cured layer with higher hardness, thereby lowering the possibility of occurrence of wire defect.

Figure 3:
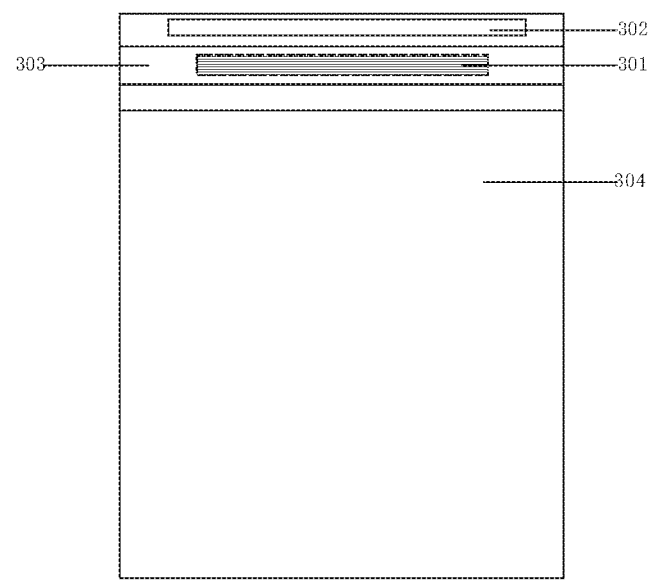
FIG. 3 is a schematic plan view illustrating an example of a second area and a cured area according to an embodiment of the present disclosure.

FIG. 3 is a schematic plan view illustrating an example of a second area and a cured area according to an embodiment of the present disclosure. As shown in FIG. 3, the second area includes an integrated-circuit-chip area 301 and a flexible-circuit-board area 302, and the integrated-circuit-chip area 301 and the flexible-circuit-board area 302 are provided at a side of a first area 304. The integrated-circuit-chip area 301 is included in a projection area of the cured layer 202 on the flexible substrate 101. In the present embodiment, this projection area corresponds to the cured area 303.

Figure 4:
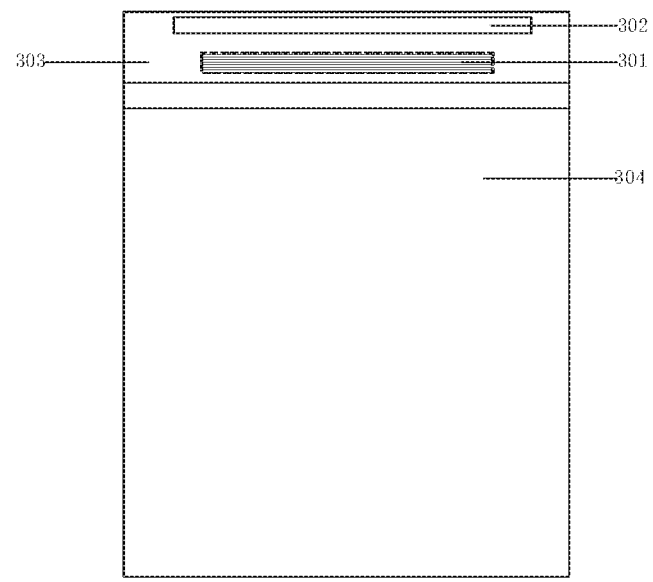
FIG. 4 is a schematic plan view illustrating another example of a second area and a cured area according to an embodiment of the present disclosure.

FIG. 4 is a schematic plan view illustrating another example of a second area and a cured area according to an embodiment of the present disclosure. As shown in FIG. 4, the second area includes an integrated-circuit-chip area 301 and a flexible-circuit-board area 302, and the integrated-circuit-chip area 301 and the flexible-circuit-board area 302 are provided at a side of a first area 304. The integrated-circuit-chip area 301 and the flexible-circuit-board area 302 are included in a projection area of the cured layer 202 on the flexible substrate 101. In the present embodiment, this projection area corresponds to the cured area 303.

The display substrate according to the present embodiment includes a flexible substrate having a first surface and a second surface opposite to each other, and the first surface includes a first area and a second area. The first area is provided with thin film transistors and light-emitting elements. The second area is provided with a lead for circuit-bonding. The second surface is provided with a curable material layer and a cured layer, and the cured layer is provided in correspondence with the second area. The cured layer is configured to be formed by performing a curing process on the curable material layer. In the technical solution provided by the present embodiment, the cured layer is provided at a position of the curable material layer corresponding to the second area, such that an area corresponding to the second area has an increased hardness. As such, in a subsequent pressure welding process (for bonding a circuit component) for the flexible display substrate, the second area has an improved stability due to the existence of the cured layer with higher hardness, thereby lowering the possibility of occurrence of wire defect.

In another aspect, the present disclosure provides a display panel, which includes any one of the display substrates described herein or fabricated by any one of methods described herein.

According to an embodiment of the present disclosure, the display substrate of the display panel includes a flexible substrate having a first surface and a second surface opposite to each other, and the first surface includes a first area and a second area. The first area is provided with thin film transistors and light-emitting elements. The second area is provided with a lead for circuit-bonding. The second surface is provided with a curable material layer and a cured layer, and the cured layer is provided in correspondence with the second area. The cured layer is configured to be formed by performing a curing process on the curable material layer. In the technical solution provided by the present embodiment, the cured layer is provided at a position of the curable material layer corresponding to the second area, such that an area corresponding to the second area has an increased hardness. As such, in a subsequent pressure welding process (for bonding a circuit component) for the flexible display substrate, the second area has an improved stability due to the existence of the cured layer with higher hardness, thereby lowering the possibility of occurrence of wire defect.

Figure 5:
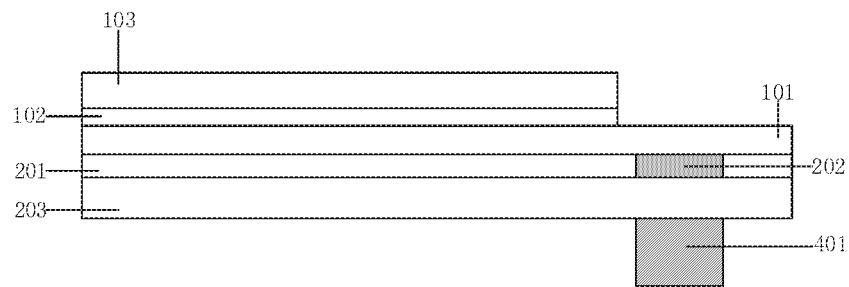
FIG. 5 is a schematic diagram illustrating a structure of a pressure welding device according to an embodiment of the present disclosure.

In another aspect, the present disclosure provides a pressure welding device. FIG. 5 is a schematic diagram illustrating a structure of a pressure welding device according to an embodiment of the present disclosure. As shown in FIG. 5, the pressure welding device is configured to perform a pressure welding process on a display substrate. The pressure welding device includes a curing unit and a pressure welding unit. The curing unit is configured to perform a curing process on a part of the curable material layer corresponding to the second area to form a cured layer, and the pressure welding unit is configured to perform a bonding process on a circuit component in the second area. The circuit component includes an integrated circuit chip and/or a flexible circuit board. The cured layer is provided at a position of the curable material layer corresponding to the second area, such that an area corresponding to the second area has an increased hardness. As such, in a subsequent pressure welding process (for bonding a circuit component) for the flexible display substrate, the second area has an improved stability due to the existence of the cured layer with higher hardness, thereby lowering the possibility of occurrence of wire defect.

Referring to FIG. 5, the display substrate includes a flexible substrate 101 having a first surface and a second surface opposite to each other, and the first surface includes a first area and a second area. The first area is provided with a light-emitting element layer 102. The light-emitting element layer 102 includes thin film transistors and light-emitting elements. The second area is provided with a lead for circuit-bonding. The second surface is provided with a curable material layer 201 and a cured layer 202, and the cured layer 202 is provided in correspondence with the second area. The cured layer 202 is configured to be formed by performing a curing process on the curable material layer 201, so that an area corresponding to the second area has an increased hardness.

An operation process according to the present embodiment is described as follows. A cutting process is performed after a back-film-attaching process is completed. After the cutting process is completed, a pre-alignment process is performed for a substrate. Then, the substrate, which is subjected to the pre-alignment process, is transferred at first to the curing unit to be cured, and then to the pressure welding unit to be pressure welded. More specifically, an anisotropic conductive film (ACF) is attached to the substrate, and then the substrate is transferred to a pre-bonding module and a main-bonding module, so as to perform a pressure welding process of an integrated circuit chip. After that, a pressure welding process of a flexible circuit board is performed.

In the present embodiment, the curable material layer 201 and the cured layer 202 are provided between the flexible substrate 101 and a back-film base 203, and an encapsulation 103 is provided on the light-emitting element layer 102. The curable material layer 201 includes a heat-curable material, and a heat-curing process is performed on the part of the curable material layer 201 corresponding to the second area to form the cured layer 202. In the present embodiment, the heat-curing process is performed on the part of the curable material layer 201 corresponding to the second part through a hot-pressing header (an example of the curing unit), which is provided in correspondence with the part of the curable material layer corresponding to the second area.

Figure 6:
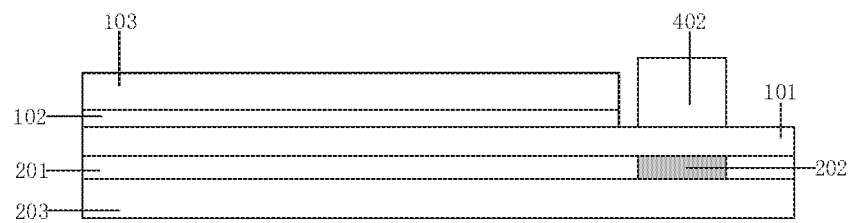
FIG. 6 is a schematic diagram illustrating another structure of a pressure welding device according to an embodiment of the present disclosure.
Figure 7:
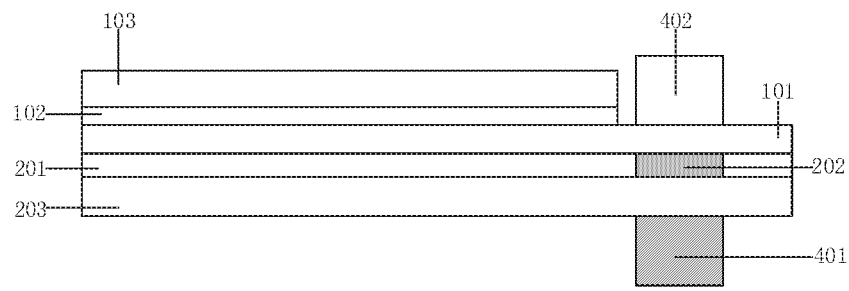
FIG. 7 is a schematic diagram illustrating still another structure of a pressure welding device according to an embodiment of the present disclosure.

FIG. 6 is a schematic diagram illustrating another structure of a pressure welding device according to an embodiment of the present disclosure, and FIG. 7 is a schematic diagram illustrating still another structure of a pressure welding device according to an embodiment of the present disclosure. Referring to FIGS. 5-7, a first hot-pressing header 401 is provided beneath the curable material layer 201. Optionally, a second hot-pressing header 402 is provided above the curable material layer 201. Optionally, the first hot-pressing header 401 is provided beneath the curable material layer 201, and meanwhile the second hot-pressing header 402 is provided above the curable material layer 201. In the present embodiment, the part of the curable material layer corresponding to the second area is heated by using the hot-pressing header(s), such that an area corresponding to the second area has an increased hardness. As such, in a subsequent pressure welding process (for bonding a circuit component) for the flexible display substrate, the second area has an improved stability due to the existence of the cured layer with higher hardness, thereby lowering the possibility of occurrence of wire defect.

The present embodiment provides a pressure welding device for performing a press welding process on a display substrate. The display substrate includes a flexible substrate having a first surface and a second surface opposite to each other, and the first surface includes a first area and a second area. The first area is provided with thin film transistors and light-emitting elements. The second area is provided with a lead for circuit-bonding. The second surface is provided with a curable material layer. A curing process is performed on the part of the curable material layer corresponding to the second area through the pressure welding device, so as to form the cured layer. In the technical solution provided by the present embodiment, a partial curing process is performed on the second area, such that an area corresponding to the second area has an increased hardness. As such, in a subsequent pressure welding process (for bonding a circuit component) for the flexible display substrate, the second area has an improved stability due to the existence of the cured layer with higher hardness, thereby lowering the possibility of occurrence of wire defect.

It can be understood that the foregoing implementations are merely exemplary implementations used for describing the principle of the present disclosure, but the present disclosure is not limited thereto. Those ordinary skilled in the art may make various variations and improvements without departing from the spirit and essence of the present disclosure, and these variations and improvements shall fall into the protection scope of the present disclosure.

What is claimed is:

1. A method of fabricating a display substrate, the display substrate comprising a flexible substrate having a first surface and a second surface opposite to each other, and the first surface comprising a first area and a second area, the method comprising:
forming thin film transistors and light-emitting elements in the first area;
forming a lead for circuit-bonding in the second area;
forming a curable material layer on the second surface; and
performing a curing process on a part of the curable material layer corresponding to the second area to form a cured layer.

2. The method of claim 1, wherein the curable material layer comprises an ultraviolet-curable material, and the step of performing the curing process on the part of the curable material layer corresponding to the second area comprises:
performing an ultraviolet-curing process on the part of the curable material layer corresponding to the second area.

3. The method of claim 1, wherein the curable material layer comprises a heat-curable material, and the step of performing the curing process on the part of the curable material layer corresponding to the second area comprises:
performing a heat-curing process on the part of the curable material layer corresponding to the second area.

4. The method of claim 1, after the cured layer is formed, further comprising:
performing a bonding process on a circuit component in the second area.

5. The method of claim 1, wherein the display substrate further comprises a back-film base, and the step of forming the curable material layer on the second surface comprises:
forming the curable material layer between the flexible substrate and the back-film base.

6. The method of claim 1, wherein the curable material layer is a back-film adhesive layer, and the step of forming the curable material layer on the second surface comprises attaching the back-film base having the back-film adhesive layer to the flexible substrate.

7. A display substrate, comprising a flexible substrate having a first surface and a second surface opposite to each other, the first surface comprising a first area and a second area, the first area being provided with thin film transistors and light-emitting elements, and the second area being provided with a lead for circuit-bonding, wherein the second surface is provided with a curable material layer and a cured layer, the cured layer is provided in correspondence with the second area, and the cured layer is configured to be formed by performing a curing process on the curable material layer.

8. The display substrate of claim 7, wherein the second area comprises an integrated-circuit-chip area and a flexible-circuit-board area, and the integrated-circuit-chip area and the flexible-circuit-board area are included in a projection area of the cured layer on the flexible substrate.

9. The display substrate of claim 7, further comprising a back-film base, wherein the curable material layer and the cured layer are provided between the flexible substrate and the back-film base.

10. The display substrate of claim 7, wherein the curable material layer is a back-film adhesive layer, and the back-film adhesive layer comprises an optical adhesive layer.

11. A display panel, comprising the display substrate according to claim 7.

12. A pressure welding device for performing a pressure welding process on a display substrate, the display substrate comprising a flexible substrate having a first surface and a second surface opposite to each other, the first surface comprising a first area and a second area, the first area being provided with thin film transistors and light-emitting elements, the second area being provided with a lead for circuit-bonding, and the second surface being provided with a curable material layer, wherein the pressure welding device comprises a curing unit and a pressure welding unit;

the curing unit is configured to perform a curing process on a part of the curable material layer corresponding to the second area to form a cured layer; and the pressure welding unit is configured to perform a bonding process on a circuit component in the second area.

13. The pressure welding device of claim 12, wherein the curing unit comprises a first hot-pressing header provided above the display substrate, and the first hot-pressing header is configured to heat the part of the curable material layer corresponding to the second area.

14. The pressure welding device of claim 12, wherein the curing unit comprises a first hot-pressing header provided above the display substrate and a second hot-pressing header provided beneath the display substrate, and the first hot-pressing header and the second hot-pressing header are configured to heat the part of the curable material layer corresponding to the second area.

15. The pressure welding device of claim 12, wherein the circuit component comprises an integrated circuit chip and/or a flexible circuit board.

16. The pressure welding device of claim 12, wherein the curing unit comprises a second hot-pressing header provided beneath the display substrate, and the second hot-pressing header is configured to heat the part of the curable material layer corresponding to the second area.

17. A method of fabricating a display substrate by using a pressure welding device, the pressure welding device being the pressure welding device of claim 12, the display substrate comprising a flexible substrate having a first surface and a second surface opposite to each other, and the first surface comprising a first area and a second area, the method comprising:

forming thin film transistors and light-emitting elements in the first area;

forming a lead for circuit-bonding in the second area;

forming a curable material layer on the second surface; and performing, by using the curing unit, a curing process on a part of the curable material layer corresponding to the second area to form a cured layer.

18. The method of claim 17, after the cured layer is formed, further comprising:

perform, by using the pressure welding unit, a bonding process on a circuit component in the second area.

* * * * *